United States Patent
Tian et al.

(10) Patent No.: US 10,135,217 B2
(45) Date of Patent: Nov. 20, 2018

(54) OPTICAL DEVICE AND EXCIMER LASER ANNEALING EQUIPMENT

(71) Applicant: BOE TECHNOLOGY GROUP CO., LTD., Beijing (CN)

(72) Inventors: Xiangjun Tian, Beijing (CN); Yan Chen, Beijing (CN); Xueyong Wang, Beijing (CN); Zhi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/796,514

(22) Filed: Oct. 27, 2017

(65) Prior Publication Data

US 2018/0277374 A1     Sep. 27, 2018

(30) Foreign Application Priority Data

Mar. 24, 2017  (CN) .......................... 2017 1 0183496

(51) Int. Cl.

| | |
|---|---|
| H01S 3/00 | (2006.01) |
| H01S 3/08 | (2006.01) |
| H01L 21/268 | (2006.01) |
| H01L 21/67 | (2006.01) |
| H01S 3/036 | (2006.01) |
| H01L 21/02 | (2006.01) |
| H01L 21/324 | (2006.01) |
| H01S 3/034 | (2006.01) |
| H01S 3/225 | (2006.01) |
| H01S 3/23 | (2006.01) |

(52) U.S. Cl.
CPC ..... *H01S 3/08059* (2013.01); *H01L 21/02422* (2013.01); *H01L 21/02595* (2013.01); *H01L 21/2686* (2013.01); *H01L 21/324* (2013.01); *H01L 21/67098* (2013.01); *H01S 3/034* (2013.01); *H01S 3/036* (2013.01); *H01S 3/225* (2013.01); *H01S 3/23* (2013.01)

(58) Field of Classification Search
CPC ...... H01S 3/034; H01S 3/036; H01S 3/08059; H01S 3/104; H01S 3/225; H01S 3/23; H01L 21/2686; H01L 21/02422; H01L 21/02595; H01L 21/324; H01L 21/67098
See application file for complete search history.

(56) References Cited

U.S. PATENT DOCUMENTS

| | | | | |
|---|---|---|---|---|
| 2004/0253839 | A1* | 12/2004 | Shimizu ............ | H01L 21/76855 438/795 |
| 2012/0069319 | A1* | 3/2012 | Maeno .................... | G01S 17/08 356/4.01 |

\* cited by examiner

*Primary Examiner* — Armando Rodriguez
(74) *Attorney, Agent, or Firm* — Kinney & Lange, P.A.

(57) ABSTRACT

The embodiments of the present disclosure provide an optical device and an excimer laser annealing equipment. The optical device includes: a light source; a transparent window spaced apart from the light source by a distance; and an optical system disposed between the light source and the transparent window. The transparent window is configured such that emergent light of the light source is vertically incident onto the transparent window after passing through the optical system.

19 Claims, 4 Drawing Sheets

OPTICAL DEVICE AND EXCIMER LASER ANNEALING EQUIPMENT

CROSS-REFERENCE TO RELATED APPLICATION

This application claims the benefit of Chinese Patent Application No. 201710183496.4 filed on Mar. 24, 2017 in the State Intellectual Property Office of China, the disclosure of which is incorporated in entirety herein by reference.

BACKGROUND

Technical Field

Embodiments of the present disclosure relate to a field of laser technology, and more particularly, to an optical device and an excimer laser annealing equipment.

Description of the Related Art

At this stage, an optical device having a combination of a light source and an optical system has been widely used in various fields. In particular, it is necessary for a laser equipment to modulate a light beam emitted from a laser source by an optical system before being applied. In many cases, a laser beam is not directly applied to a material which needs to be treated by the laser beam, but is transmitted through other transparent mediums and then incident onto the material to be treated.

However, in such provision, the light needs to go through the transparent mediums firstly before it is transmitted outside through the optical system, and the transparent mediums will undoubtedly have an attenuation effect on the light emitted. An annealing window for example in an excimer laser annealing equipment is typically a flat mirror of a sealed annealing chamber, and such a annealing window can provide a good seal for nitrogen atmosphere in the chamber and prevent dust particles from entering into the chamber. However, after the laser passes through the annealing window, the final light energy in light path output is reduced relative to the light energy emitted from the laser by 20%-35%. This not only wastes the light energy from the light source, but also reduces a stability of the light source, while random reflected light is refracted and reflected repeatedly through the optical system, thereby interfering with a normal light transmission of the optical system.

SUMMARY

According to a first aspect, an embodiment of the present disclosure provides an optical device, comprising:
a light source;
a transparent window spaced apart from the light source by a distance; and
an optical system disposed between the light source and the transparent window,
wherein the transparent window is configured such that emergent light of the light source is vertically incident onto the transparent window after passing through the optical system.

In a possible implementation, in the optical device according to the embodiment of the present disclosure, the transparent window has a structure of cambered surface.

In a possible implementation, in the optical device according to the embodiment of the present disclosure, the emergent light of the light source becomes convergent light after it passes through the optical system; and
the transparent window has a structure of cambered surface recessed towards the optical system.

In a possible implementation, in the optical device according to the embodiment of the present disclosure, the emergent light of the light source becomes divergent light after it passes through the optical system; and
the transparent window has a structure of cambered surface protruding away from the optical system.

In a possible implementation, in the optical device according to the embodiment of the present disclosure, the transparent window has a uniform thickness.

In a possible implementation, in the optical device according to the embodiment of the present disclosure, an antireflection film is provided on a light entrance surface of the transparent window.

In a possible implementation, in the optical device according to the embodiment of the present disclosure, the light source and the optical system are both disposed within an enclosed working chamber having the transparent window.

In a possible implementation, in the optical device according to the embodiment of the present disclosure, the optical device is an excimer laser annealing device; and
the light source is a laser source, and the transparent window is an annealing window.

In a possible implementation, in the optical device according to the embodiment of the present disclosure, an optical element in the optical system that is closest to the annealing window is a converging lens group; and
the annealing window has a structure of cambered surface recessed towards the converging lens group.

In a possible implementation, in the optical device according to the embodiment of the present disclosure, a distance between the converging lens group and the annealing window is less than a focal length of the converging lens group.

In a possible implementation, in the optical device according to the embodiment of the present disclosure, the annealing window has a curvature of 0.015-0.02.

According to a second aspect, an embodiment of the present disclosure provides an excimer laser annealing equipment, comprising the optical device according to any one of the above embodiments.

DETAILED DESCRIPTION OF PREFERRED EMBODIMENTS

Embodiments of the present disclosure provide an optical device and an excimer laser annealing equipment for at least partially reducing attenuation of a transparent window to emergent light.

In order to make clear the above objectives, technical solutions and advantages of the present disclosure, the embodiments of the present disclosure will be further described in detail with reference to the accompanying drawings. It will be apparent that the described embodiments are merely part of the present disclosure and do not represent all the embodiments. All other embodiments obtained by those skilled in the art based on the embodiments of the present disclosure without creative work fall within the scope of the present disclosure.

Figure 1:
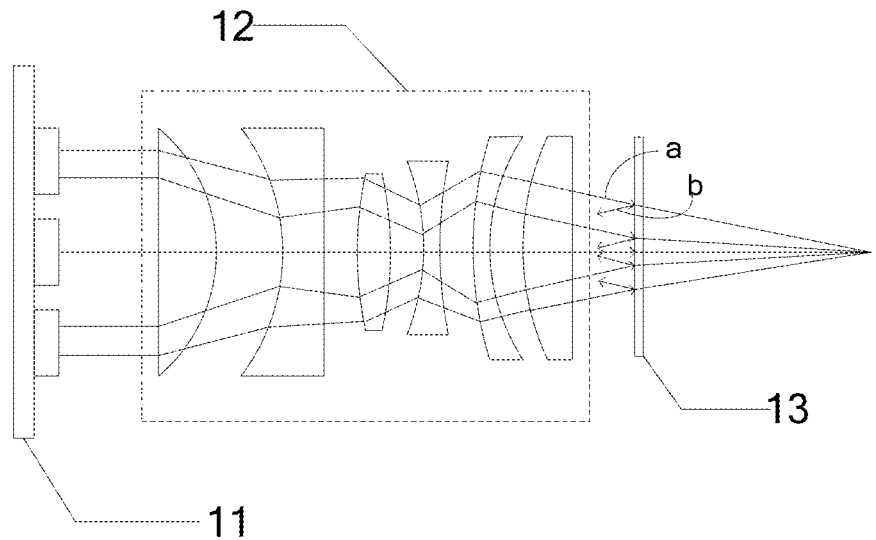
FIG. 1 is a schematic structural view of an optical device in the related art.

A structure of an optical device in the related art has been shown in FIG. 1. The optical device includes a light source 11 and an optical system 12 for modulating emergent light of the light source 11, which is emitted outwardly from a transparent window 13 and is applied to other mediums. As can be seen from FIG. 1, the transparent window 13 of the optical device is a transparent flat mirror, and light rays which are finally directed to a surface of the transparent window 13 have different incident angles, while the light is inevitably reflected on the surface of the flat mirror to form reflected light b. The reflected light b follows the law of reflection to be redirected in a direction of the optical system, which makes the transparent window 13 have an attenuation effect on the emergent light. The optical system 12 is typically composed of a plurality of lenses, and under the effect of these lenses, the reflected light b is affected by the various lenses again such that many reflections and refractions occur. Since the incident angle of the light is not known, the direction of the emergent light after the reflection and refraction is also unknown, which will disturb the normal working light of the optical system, and present stray light to destroy the stability of the light source and the optical system.

Figure 2:
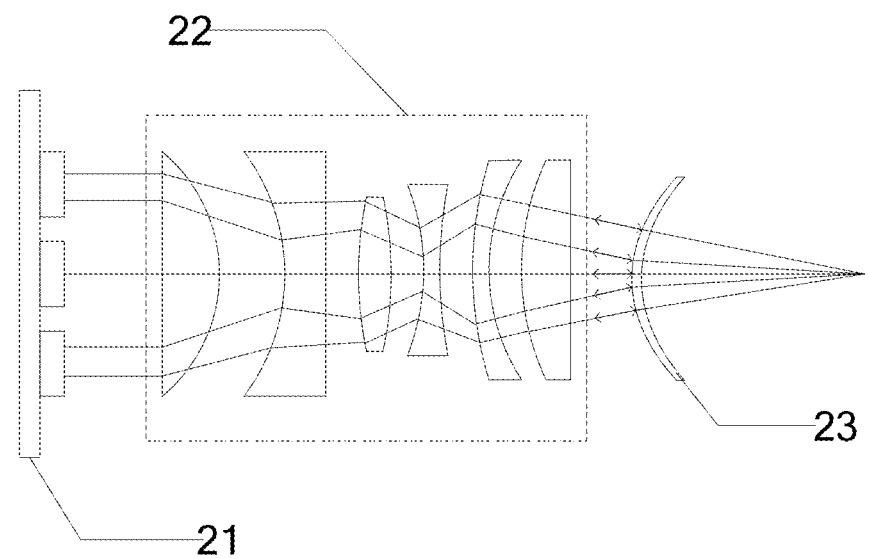
FIG. 2 is a schematic structural view of an optical device according to an embodiment of the present disclosure.

In view of this, an embodiment of the present disclosure provides an optical device, comprising: a light source 21; a transparent window 23 spaced apart from the light source by a distance; and an optical system 22 disposed between the light source 21 and the transparent window 23, as shown in FIG. 2.

In the embodiment, the transparent window 23 is constructed such that emergent light of the light source 21 is vertically incident onto the transparent window 23 after passing through the optical system 22.

Figure 3:
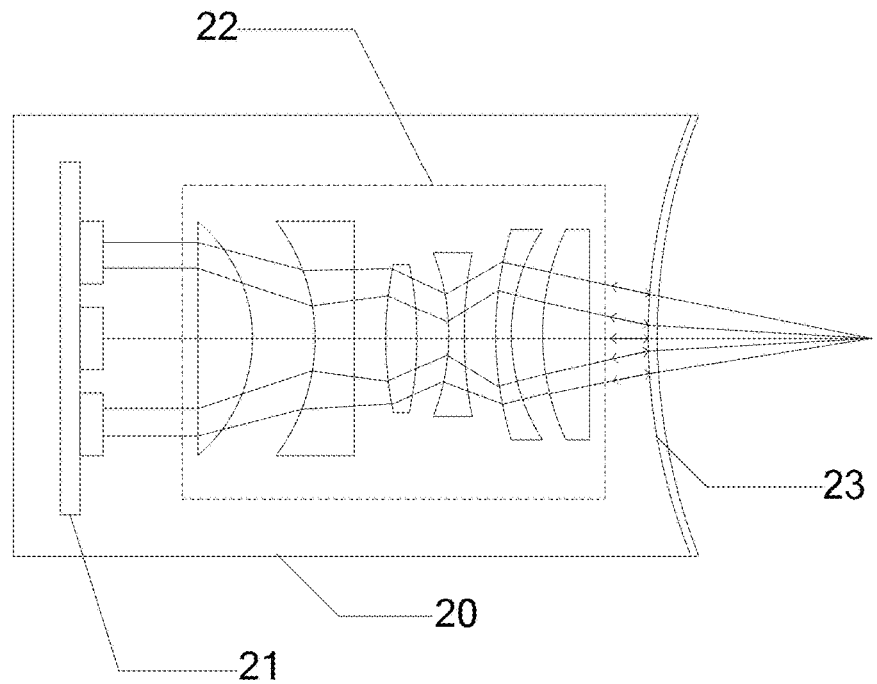
FIG. 3 is a schematic structural view of an optical device according to another embodiment of the present disclosure.

In actual applications, as shown in FIG. 3, the light source 21 and the optical system 22 are generally disposed inside an enclosed working chamber 20 having the transparent window 23, so as to block the light source 21 and the optical system 22 from external environment and further avoid from being contaminated by gas and dust in the external environment.

In the optical device according to the embodiment of the present disclosure, the transparent window is configured such that it is perpendicular to the light which is incident on the surface thereof. According to the reflection law of light and the reversibility principle of optical path, it is known that the light which is vertically directed to the surface of the transparent window can be reflected and returned back in the original path, and then after the reflection of optical lenses in the optical system and/or the light source, this part of reflected light can be emitted to the transparent window as new emergent light, and a propagation direction of this emergent light is the same as a propagation direction of the original emergent light. Thus, the light reflected by the transparent window can be again used as new emergent light, improving energy density of light finally arriving at the transparent window, effectively reducing attenuation of the transparent window to light source energy, and saving energy.

Figure 4:
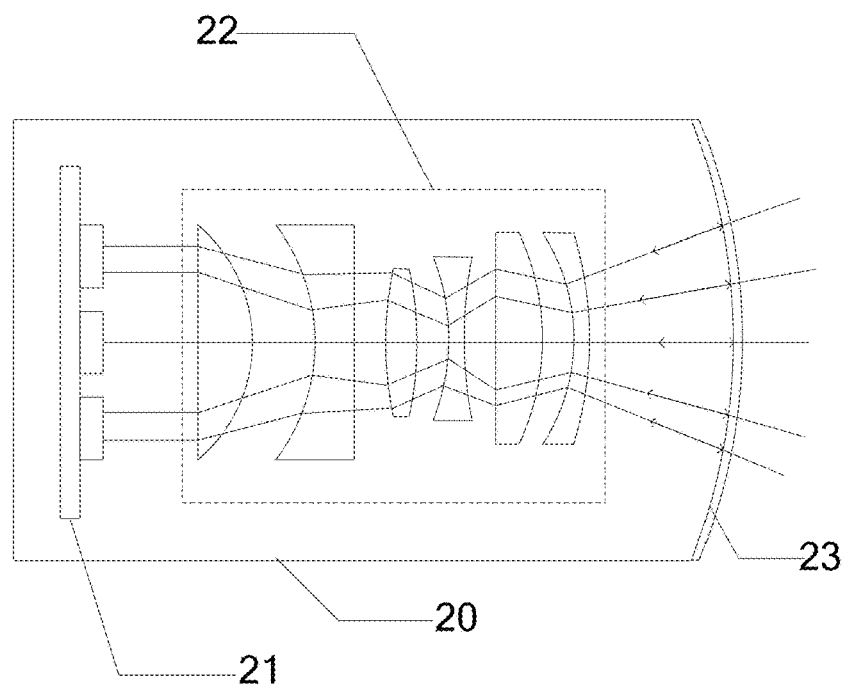
FIG. 4 is a schematic structural view of an optical device according to a further embodiment of the present disclosure.

As an alternative embodiment, as shown in FIGS. 3 and 4, the transparent window 23 may be configured to have a structure of cambered surface which is at 90 degrees with respect to respective incident light rays illuminating the surface of the transparent window. With the above arrangement, the reflected light of the incident light on the transparent window 23 can be returned back in the original path, and then redirected to the transparent window after the reflection of the optical system and/or the light source, thereby reducing the attenuation effect of the transparent window on the light as far as possible.

In actual applications, the light undergoing the action of the optical system 22 is usually present in two forms, convergence and divergence, and accordingly, the structure of cambered surface of the transparent window 23 according to the embodiment of the present disclosure needs to be matched with the form of the light.

Specifically, as shown in FIG. 3, the transparent window 23 may be configured to have a structure of cambered surface recessed towards the optical system (i.e., towards the interior of the working chamber) if the emergent light of the light source 21 becomes convergent light after it passes through the optical system 22.

As shown in FIG. 4, the transparent window 23 may be configured to have a structure of cambered surface protruding away from the optical system (i.e., towards the external of the working chamber) if the emergent light of the light source 21 becomes divergent light after it passes through the optical system 22.

In the above optical device according to the embodiment of the present disclosure, providing the transparent window with a structure of cambered surface is intended to allow the light incident on the transparent window at an angle of substantially 90 degrees with respect to a light entrance surface of the structure of cambered surface, such that the reflected light may be returned back in the original path. Therefore, if the light becomes convergent light after it passes through the optical system 22, the transparent window 23 should be configured to have a structure of cambered surface recessed towards the working chamber. Accordingly, if the light becomes divergent light after it passes through the optical system 22, the transparent window 23 should be configured to have a structure of cambered surface protruding towards the outside of the working chamber. In actual applications, the transparent window 23 may be of a spherical curved surface structure or an aspherical curved surface structure, depending on the incident angles of the incident light rays, which will not be limited herein.

Further, in the above optical device according to the embodiment of the present disclosure, the thicknesses of the various portions of the transparent window 23 are uniform. Since the optical system 22 functions to modulate the emergent light of the light source 21, and the arrangement of the lenses in the optical system 22 is predetermined according to the emergent light of the light source 21, and the light has been adjusted to an optimum state after passing through the optical system 22; the transparent window 23 no longer applies any other deflection to the light. Therefore, in the above optical device according to the embodiment of the present disclosure, the thicknesses of the various portions of the transparent window 23 having the structure of cambered surface are uniformly set such that the transparent window does not have an effect of lens, that is, it does not have a deflection effect on the light, and in actual applications, the flat mirror of uniform thickness is also easier to be produced.

Figure 5:
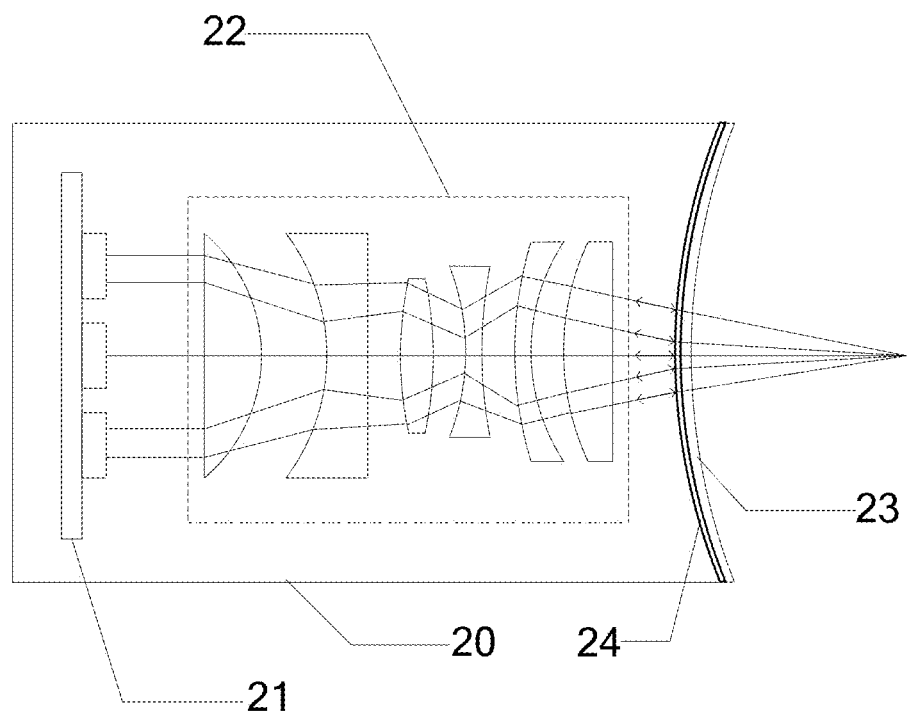
FIG. 5 is a schematic structural view of an optical device according to a still further embodiment of the present disclosure.

As an alternative embodiment, in the above optical device according to the embodiment of the present disclosure, as shown in FIG. 5, an antireflection film 24 may be provided on a light entrance surface of the transparent window 23. Further, a refractive index of the antireflection film 24 may be between a refractive index of ambient medium in the working chamber and a refractive index of the transparent window 23, and a thickness of the antireflection film 24 is ¼ of a wavelength of light in the antireflection film medium. In this way, the reflected light can be counteracted when the light is emitted from the inside of the working chamber to the transparent window 23, thereby increasing the transmission of the light and further improving the utilization of the emergent light of the light source.

In actual applications, the above optical device according to the embodiment of the present disclosure may be an excimer laser annealing device for performing crystallization annealing on a display screen glass. If the optical device is an excimer laser annealing device, the light source 21 is a laser source, in particular an excimer laser, and the transparent window 23 is an annealing window of the excimer laser annealing device. In the excimer laser annealing device, the annealing window has a function of encapsulating an annealing chamber, and can provide a good seal for the nitrogen atmosphere in the chamber and also prevent the dust particles from entering into the chamber. The laser beam emitted by the excimer laser has a rectangular cross section in an ideal state, and after the processing of the optical system, a linear light source for illuminating and crystallizing the glass is finally formed. Moreover, an optical element in the optical system that is closest to the annealing window is a converging lens group, and the light passing through the lens group is converged and emitted out of the annealing chamber. According to the above description, in order to reduce the attenuation effect of the annealing window on the linear light source, the annealing window may be configured to have a structure of cambered surface recessed towards the inside of the annealing chamber.

Figure 6:
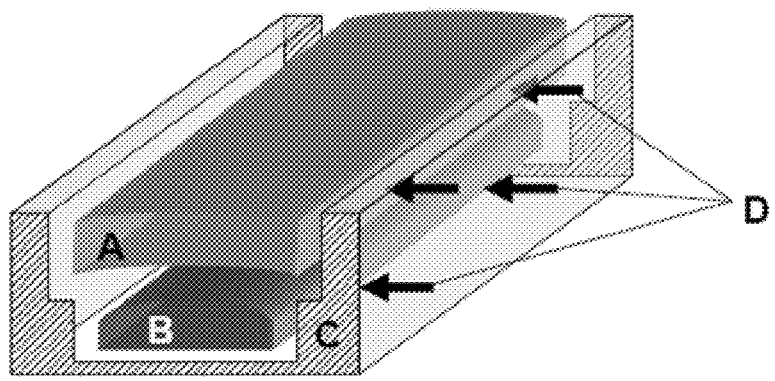
FIG. 6 is a schematic structural view of a converging lens group according to an embodiment of the present disclosure.

In actual applications, the structure of the converging lens group in the excimer laser annealing device is shown in FIG. 6, and the converging lens group is a combination of a concave-convex lens A and a plano-convex lens B, and the two lenses can be fixed in a lens mount C, and fixed and adjusted by adjustment screws D at two sides thereof.

Further, photons generated by a high-voltage ionization inside the excimer laser are emitted in all directions, therefore a photon oscillating sheet is provided within the excimer laser and on a side of the excimer laser which is deviated away from the optical system, and the photon oscillating sheet may be a flat mirror. Thus, the photons that are originally emitted in an opposite direction of the optical system can be incident on the photon oscillating sheet, and then be emitted to a side of the optical system after the reflection of the photon oscillating sheet, thereby increasing a luminous flux of light emitted to the optical system. It is just the provision of the photon oscillating sheet in the excimer laser, so that after the light is perpendicularly emitted to the annealing window having the structure of cambered surface through the optical system, the reflected light is emitted to the excimer laser via the optical system along the original path, and then is reflected by the photon oscillating sheet. In this way, it is emitted to the optical system and the annealing window again along the original optical path of the emitting light. Thereby, the reflected light which is emitted to the annealing window can be reused, greatly improving the light utilization.

Figure 7:
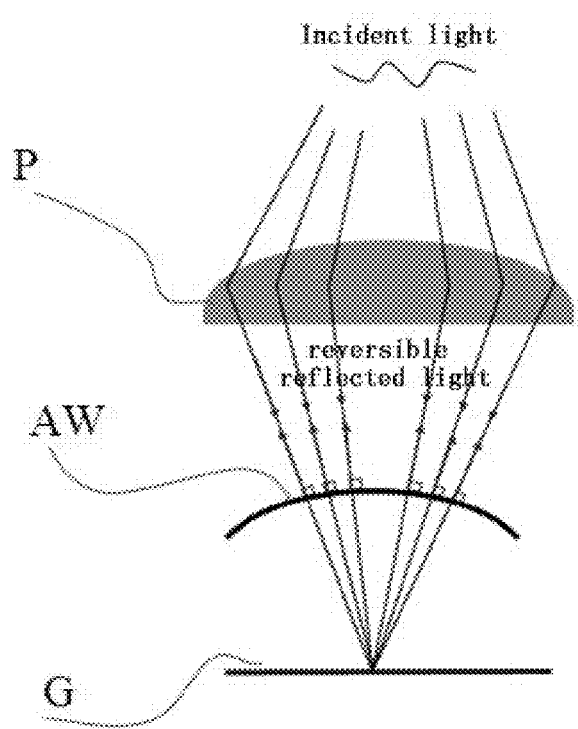
FIG. 7 is an optical path diagram of an excimer laser annealing device according to an embodiment of the present disclosure.

The optical path in which the light passes through the converging lens group in the optical system and the annealing window and finally reaches the glass to be annealed is shown in FIG. 7, and the light emitted by the laser becomes convergent light after it is finally emitted to the converging lens group P in the optical system. When the convergent light is emitted to the annealing window AW having the structure of cambered surface, it is possible to form a reversible reflected light (in terms of optical path) on the surface of the annealing window and to redirect it in the direction of the optical system since the annealing window AW is perpendicular to the incident light. While the light passing through the annealing window AW is deflected towards the focal point of the converging lens group P, therefore, the energy density of the linear light source passing through the converging lens group is the largest at the focal point. Normally, the glass G to be annealed should be placed on the focal point of the converging lens group P, therefore, the annealing window AW should be provided between the converging lens group P and the focal point of the converging lens group P.

In general, the focal length of the converging lens group P is between 150 and 200 mm. Since the structure of cambered surface of the annealing window AW is perpendicular to the incident light and the annealing window AW is located within the focal length of the converging lens group, the distance between the annealing window AW and the focal point of the converging lens group P may be 50-65 mm. Therefore, if the structure of cambered surface of the annealing window is located on a spherical surface, the curvature of the annealing window can be set between 0.015 and 0.02.

According to the same design concept, a specific embodiment of the present disclosure also provides an excimer laser annealing equipment, comprising any one of the optical devices described above. The optical device is an excimer laser annealing device, when it is specifically implemented, the glass to be annealed is placed on the light exit side of the excimer laser annealing device and the position of the glass is adjusted so that the energy density of the linear light source is the largest.

The optical device and the excimer laser annealing equipment according to the embodiments of the present disclosure include: a light source; a transparent window spaced apart from the light source by a distance; and an optical system disposed between the light source and the transparent window, wherein the transparent window is configured such that emergent light of the light source is vertically incident onto the transparent window after passing through the optical system. Since the emergent light of the light source is perpendicularly emitted to the transparent window after passing through the optical system, the reflected light reflected from the transparent window back to the optical system can be returned in an opposite direction of the incident light along the original path so that the reflected light reflected by the optical lens in the light source and/or the optical system is redirected to the transparent window and the propagation direction of this emergent light is the same as that of the original emergent light. Thus, the light reflected by the transparent window can be reused as new emergent light, improving energy density of light finally arriving at the transparent window, effectively reducing attenuation of the transparent window to light source energy, and saving energy.

While optional embodiments of the present disclosure have been described, those skilled in the art can make further changes and modifications to these embodiments once the basic inventive concept is known. Accordingly, the appending claims are intended to be construed as including optional embodiments and all changes and modifications that fall within the scope of the present disclosure.

It will be apparent that various changes and modifications can be made to the present disclosure by those skilled in the art without departing from the spirit and scope of the present disclosure. Thus, the present disclosure is intended to include such changes and modifications if the changes and modifications fall within the scope of the claims of the present disclosure and the equivalents thereof.

What is claimed is:

1. An optical device, comprising:
   a light source;
   a transparent window spaced apart from the light source by a distance; and
   an optical system disposed between the light source and the transparent window,
   wherein the transparent window is configured such that emergent light of the light source is vertically incident onto the transparent window after passing through the optical system,
   wherein the transparent window has a structure of cambered surface.

2. The optical device according to claim 1, wherein the emergent light of the light source becomes convergent light after it passes through the optical system; and
   the transparent window has a structure of cambered surface recessed towards the optical system.

3. The optical device according to claim 1, wherein the emergent light of the light source becomes divergent light after it passes through the optical system; and
   the transparent window has a structure of cambered surface protruding away from the optical system.

4. The optical device according to claim 1, wherein the transparent window has a uniform thickness.

5. The optical device according to claim 1, wherein the transparent window has a uniform thickness.

6. The optical device according to claim 2, wherein the transparent window has a uniform thickness.

7. The optical device according to claim 3, wherein the transparent window has a uniform thickness.

8. The optical device according to claim 1, wherein an antireflection film is provided on a light entrance surface of the transparent window.

9. The optical device according to claim 1, wherein an antireflection film is provided on a light entrance surface of the transparent window.

10. The optical device according to claim 2, wherein an antireflection film is provided on a light entrance surface of the transparent window.

11. The optical device according to claim 3, wherein an antireflection film is provided on a light entrance surface of the transparent window.

12. The optical device according to claim 1, wherein the light source and the optical system are both disposed within an enclosed working chamber having the transparent window.

13. The optical device according to claim 1, wherein the light source and the optical system are both disposed within an enclosed working chamber having the transparent window.

14. The optical device according to claim 2, wherein the light source and the optical system are both disposed within an enclosed working chamber having the transparent window.

15. The optical device according to claim 1, wherein the optical device is an excimer laser annealing device; and
    the light source is a laser source, and the transparent window is an annealing window.

16. The optical device according to claim 15, wherein an optical element in the optical system that is closest to the annealing window is a converging lens group; and
    the annealing window has a structure of cambered surface recessed towards the converging lens group.

17. The optical device according to claim 16, wherein a distance between the converging lens group and the annealing window is less than a focal length of the converging lens group.

18. The optical device according to claim 16, wherein the annealing window has a curvature of 0.015-0.02.

19. An excimer laser annealing equipment, comprising the optical device according to claim 1.

* * * * *